(12) United States Patent
Chen

(10) Patent No.: US 7,072,161 B2
(45) Date of Patent: Jul. 4, 2006

(54) HIGH ESD STRESS SUSTAINING ESD PROTECTION CIRCUIT

(75) Inventor: Wei-Fan Chen, Taichung (TW)

(73) Assignee: Winbond Electronics Corporation, Hsinchu (TW)

( * ) Notice: Subject to any disclaimer, the term of this patent is extended or adjusted under 35 U.S.C. 154(b) by 232 days.

(21) Appl. No.: 10/272,061

(22) Filed: Oct. 15, 2002

(65) Prior Publication Data

US 2003/0076639 A1 Apr. 24, 2003

(30) Foreign Application Priority Data

Oct. 19, 2001 (TW) ............................. 90125931 A

(51) Int. Cl.
*H02H 9/00* (2006.01)
(52) U.S. Cl. .......................... 361/91; 361/56
(58) Field of Classification Search ............ 361/50–58, 361/91, 111, 91.1
See application file for complete search history.

(56) References Cited

U.S. PATENT DOCUMENTS

| | | | | |
|---|---|---|---|---|
| 5,173,755 A * | 12/1992 | Co et al. | ...................... | 257/361 |
| 5,587,685 A * | 12/1996 | Johansson | .................... | 327/546 |
| 5,917,220 A * | 6/1999 | Waggoner | ................... | 257/360 |
| 5,946,177 A * | 8/1999 | Miller et al. | ................... | 361/56 |
| 5,990,723 A * | 11/1999 | Tanase | ........................ | 327/313 |
| 6,353,521 B1 * | 3/2002 | Gans et al. | .................... | 361/56 |
| 6,501,632 B1 * | 12/2002 | Avery et al. | ................. | 361/111 |

FOREIGN PATENT DOCUMENTS

CN 1175795 A 3/1998

* cited by examiner

*Primary Examiner*—Stephen W. Jackson
*Assistant Examiner*—Danny Nguyen
(74) *Attorney, Agent, or Firm*—Birch, Stewart, Kolasch & Birch, LLP

(57) ABSTRACT

An ESD protection circuit suitable for application to an IC. The ESD protection circuit includes a primary discharging component and an ESD detection circuit. The primary discharging component has a control end. The ESD detection circuit comprises a capacitor, a first resistor and a second resistor. The capacitor and the first resistor are formed in series and coupled between the control and a first pad of the IC. The second resistor is coupled between a second pad of the IC and the control end. The primary discharging component is closed during normal power operations, and triggered by the ESD detection circuit during an ESD event. During an ESD event, the capacitance becomes short-circuited, leaving voltages at the control end dominated by a resistive voltage divider formed by the first resistor and the second resistor. The ESD detection circuit provides a suitable voltage to the control end allowing the primary discharging component to release the optimum amount of ESD stress.

3 Claims, 5 Drawing Sheets

US 7,072,161 B2

HIGH ESD STRESS SUSTAINING ESD PROTECTION CIRCUIT

Pursuant to 35 U.S.C. § 119(a)–(d), this application claims priority from Taiwanese application no. 90125931, filed on Oct. 19, 2001.

BACKGROUND OF THE INVENTION

1. Field of the Invention

The present invention relates in general to an electrostatic discharge (ESD) protection circuit. In particular, the present invention relates to an ESD protection circuit suitable for application in an integrated circuit (IC).

2. Description of the Related Art

FIG. 1 shows a conventional ESD protection circuit of an IC. The ESD protection circuit 10 has an NMOS $N_{ESD}$ coupled between a pad 12 and a power line $V_{SS}$. A RC coupling circuit is formed by a capacitor C and a resistor R in the circuit. When an ESD voltage, positive with respect to the power line $V_{SS}$ occurs at the pad 12, a positive voltage is coupled to a gate of the NMOS $N_{ESD}$ enhancing the triggering rate of the NMOS $N_{ESD}$. Generally, an IC chip with ESD protection circuits must sustains more than the minimum human-body-mode (HBM) ESD stress, 2 k volts. However, when the gate of the NMOS $N_{ESD}$ is over- or under-stressed, ESD protection of ICs provided by the ESD protection circuit in FIG. 1 is compromised. FIG. 2 shows a fixed voltage applied to the gate of the NMOS $N_{ESD}$ in FIG. 1. An experimental result of voltages at the gate of the NMOS $N_{ESD}$ against the highest voltage $N_{ESD}$ can sustain is shown in FIG. 3. Voltages applied to the gate of the NMOS $N_{ESD}$ allow a triggering voltage of the NMOS $N_{ESD}$ to decreaseer. As shown in FIG. 3, when bias voltages at the gate of the NOS $N_{ESD}$ is small and is increased, ESD stress sustainable by the NMOS $N_{ESD}$ increases. Nevertheless, when bias voltages at the gate of the NMOS $N_{ESD}$ passes an optimized point and is overly increased, large ESD current crossing a thin channel under the NMOS $N_{ESD}$ easily damages the NOS $N_{ESD}$ and causes ESD level sustained by the NMOS $N_{ESD}$ to drop. ESD protection provided by the circuit in FIG. 2 is optimized by bringing a bias voltage at the gate of the NMOS $N_{ESD}$ to a specified amplitude, such as $V_{Gopt}$ in FIG. 3. Therefore, it has become an object for circuit designers to bring bias voltages at the gate of the NMOS $N_{ESD}$ in FIG. 1 to the specified amplitude $V_{Gopt}$ during an ESD event.

The ESD protection circuit in FIG. 1 may be unreliable during an ESD event. Capacitances of parasitic capacitors, such as $C_{gd}$ and $C_{gs}$, formed in the NMOS $N_{ESD}$ sway during different manufacturing processes. Voltages coupled from ESD stress at the pad 12 to the gate of the NMOS $N_{ESD}$ are undoubtedly affected by the changing capacitances. In addition, ESD stresses occur on the pad 12 at different rates. Therefore, voltages coupled to the gate of the NMOS $N_{ESD}$ are unpredictable, resulting in unreliable performance. For instance, the circuit in FIG. 1 might have sustained a HBM ESD stress of 5 kv, but fails to sustain a HBM ESD stress of 2 kv. Voltages at the gate of the NMOS $N_{ESD}$ in the circuit of FIG. 1 are thus hard to control and are unpredictable during a manufacturing process.

SUMMARY OF THE INVENTION

An object of the present invention is to provide an ESD protection circuit having an ESD detection circuit. The ESD detection circuit provides an appropriate gate voltage to a MOS optimizing ESD protection provided by the ESD protection circuit.

In accordance with the object described, the present invention provides an ESD protection circuit, suitable for application in an IC. The ESD protection circuit comprises a primary discharging component and an ESD detection circuit. The primary discharging component has a control end. The ESD detection circuit comprises a capacitor, a first resistor, and a second resistor. The capacitor and the first resistor are formed in series and coupled between the control and a first pad of the IC. The second resistor is coupled between a second pad of the IC and the control end. The primary discharging component is closed during normal power operations, and triggered by the ESD detection circuit during an ESD event.

The combination of the first pad and the second pad may be a power line and a pad, or two power lines. The primary discharging component can be an NMOS or a PMOS.

The ESD protection circuit of the present invention is suitable for application to a primary or secondary ESD protection circuit of an I/O pad.

Capacitance of the capacitor must be properly selected. The capacitance, on one hand, should be low enough during normal power operations that voltages coupled to the control end are not too large to trigger the discharging component, and on the other hand should be high enough that the capacitance resembles a short circuit during an ESD event.

During an ESD event, the ends of the capacitance are short-circuited, leaving voltages at the control end dominated by a resistive voltage divider formed by the first resistor and the second resistor. Control of voltages at the control end allows ESD protection provided by the primary discharging component to be optimized.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can be more fully understood from the detailed description given hereinbelow and the accompanying drawings, which are given by way of illustration only, and thus are not limitative of the present invention, and wherein.

DETAILED DESCRIPTION OF THE PREFERRED EMBODIMENT

Figure 4:
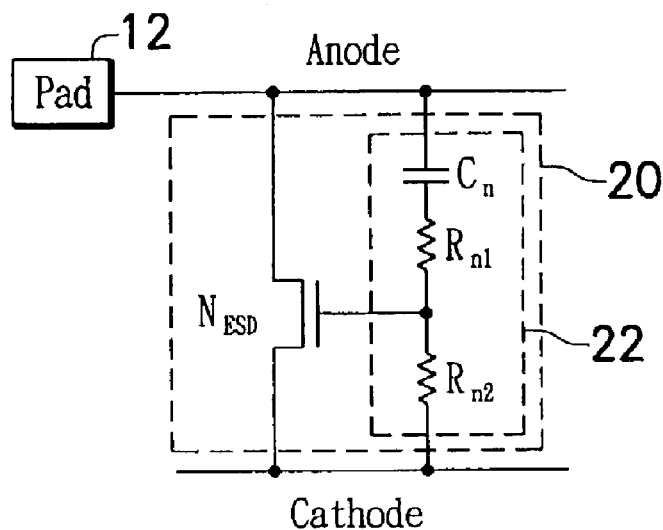
FIG. 4 is an ESD protection circuit of the present invention having an NMOS.

FIG. 4 is an ESD protection circuit of the present invention having an NMOS. The ESD protection circuit 20 in FIG. 4 is coupled between an anode and a cathode and comprises an NMOS $N_{ESD}$ and an ESD detection circuit 22. The ESD detection circuit 22 distinguishes an ESD event from normal operations. The NMOS $N_{ESD}$ is closed during normal power operations and turned on during an ESD event. The ESD detection circuit 22 has a capacitor $C_n$, a resistor $R_{n1}$, and a resistor $R_{n2}$. The capacitor $C_n$ and the resistor $R_{n1}$ are coupled between the anode and a gate of the NMOS $N_{ESD}$ with flexible sequence. The resistor $R_{n2}$ is coupled between the gate of the NMOS $N_{ESD}$ and the cathode.

The anode and the cathode are respectively coupled to two pads, such as I/O pads or power lines. The anode is coupled to a high voltage with respect to the cathode during normal power operations.

The capacitance of the capacitor $C_n$, on one hand, has to be low enough so that voltages coupled to a gate of the NMOS $N_{ESD}$ are not too high to trigger the NMOS $N_{ESD}$ during normal power operations (having low operational frequency), and on the other hand, has large enough so that the capacitor $C_n$ resembles a state of short circuit with respect to the resistors $R_{n1}$ and $R_{n2}$ during an ESD event (having high operational frequency). This is realized using the impedance $(=1/(2*pi*C_n*f))$ of the capacitor $C_n$ fluctuating with operational frequencies f.

During normal power operations, the gate of the NMOS $N_{ESD}$ is coupled to the cathode having a low voltage through the resistor $R_{n2}$ so that the NMOS $N_{ESD}$ is turned off to avoid current leakage.

When a positive ESD stress with respect to the cathode occurs at the anode, voltages $(V_G)$ at the gate of the NMOS $N_{ESD}$ can be represented with an equation (1):

$$V_G = V_{A-C} * R_{n2}/(R_{n1}+R_{n2}+1/(2*pi*C_n*f)) \quad (1)$$

$V_{A-C}$ represents the voltage difference between the anode and the cathode. The capacitor $C_n$ resembles a short circuit with respect to the resistors $R_{n1}$ and $R_{n2}$ ($R_{n1}$, $R_{n2} >> 1/(2*pi*C_n*f)$). The equation (1) can thus be simplified to an equation (2) as follows:

$$V_G = V_{A-C} * R_{n2}/(R_{n1}+R_{n2}) \quad (2)$$

Figure 1:
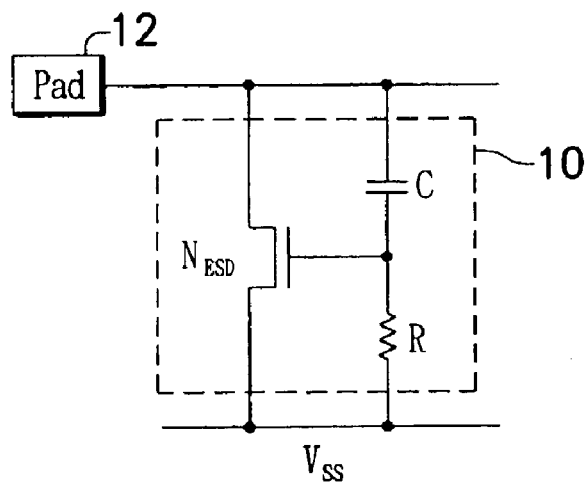
FIG. 1 is a conventional ESD protection circuit in an IC.
Figure 2:
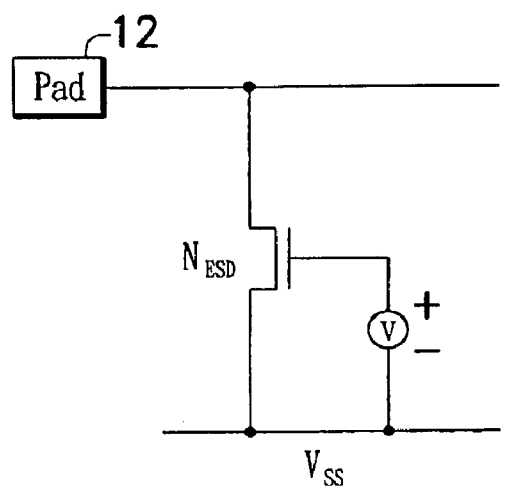
FIG. 2 is a schematic diagram showing a fixed voltage applied on the gate of the NMOS $N_{ESD}$ in FIG. 1.
Figure 3:
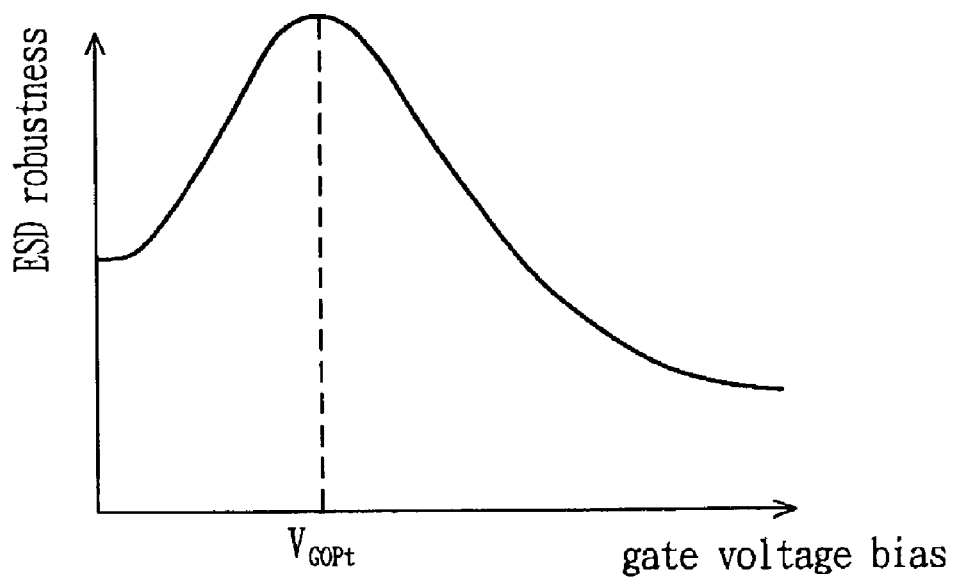
FIG. 3 is a diagram showing gate voltages against ESD stress sustained.
Figure 6:
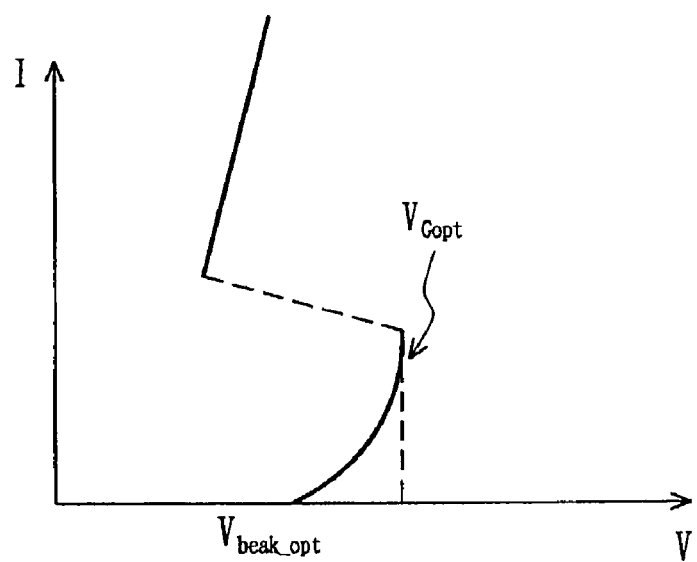
FIG. 6 is a diagram of voltages against current when the bias voltage at the gate of the NMOS $N_{ESD}$ is $V_{Gopt}$.

As shown in FIG. 3, the optimum amount of ESD stress sustainable by the ESD protection circuit 20 is recorded when the ESD protection circuit 20 is triggered at a bias voltage of $V_{Gopt}$ at the gate of the NMOS $N_{ESD}$. FIG. 6 shows a diagram of voltages against current for the protection circuit 20 when a bias voltage at the gate of the NMOS $N_{ESD}$ in FIG. 4 is $V_{Gopt}$. Once voltage at the anode reaches $V_{break\_opt}$ in a condition that the bias voltage at the gate of the NMOS $N_{ESD}$ is $V_{Gopt}$, snapback occurs at the NMOS $N_{ESD}$ to release the ESD current. Namely, when the bias voltage at the gate of the NMOS $N_{ESD}$ is $V_{Gopt}$, the maximum voltage at the anode is $V_{break\_opt}$. Such a character is applied into the equation (2) to optimize the ESD protection circuit 20 in FIG. 4 and result in the following equation:

$$V_{Gopt} = V_{break\_opt} * R_{n2}/(R_{n1}+R_{n2}) \quad (3)$$

Once such a relationship between the resistors $R_{n1}$ and $R_{n2}$ is acquired, the NMOS $N_{ESD}$ is triggered when the voltage across the anode and the cathode reaches $V_{break\_opt}$ and the voltage at the gate of the NMOS $N_{ESD}$ is at $V_{Gopt}$. The ESD stress is released and the optimum ESD protection is performed.

Figure 5:
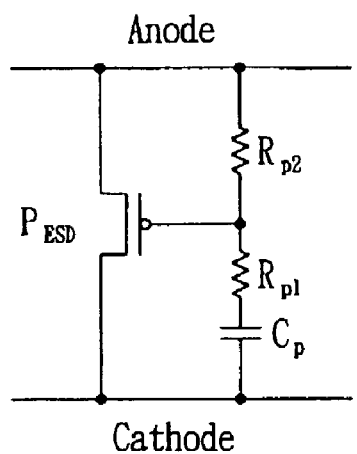
FIG. 5 is an ESD protection circuit of the present invention having a PMOS.

Similarly, the ESD protection circuit in the present invention can be implemented by a PMOS in FIG. 5. As in FIG. 4, connections of components in FIG. 5 are displayed without further descriptions.

Figure 7:
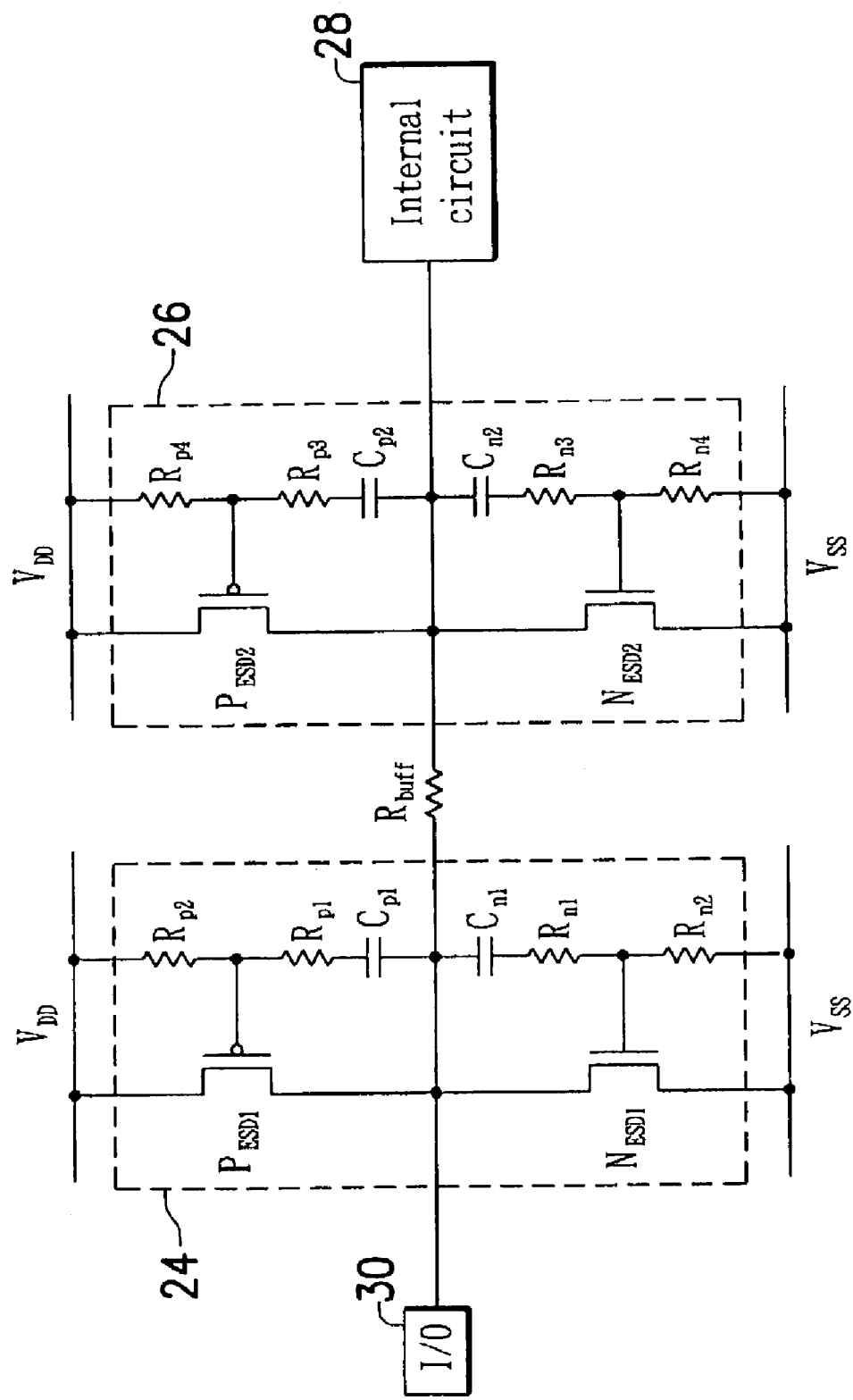
FIG. 7 is a two stage ESD protection circuit of the present invention implemented by ESD protection circuits.

FIG. 7 is a schematic diagram of a two-stage ESD protection circuit implemented by ESD protection circuits of the present invention. The two-stage ESD protection circuit comprises a primary ESD protection circuit 24, a resistor $R_{buff}$ and a secondary ESD protection circuit 26. An ESD protection circuit of the present invention is formed in the primary ESD protection circuit 24 by an NMOS $N_{ESD1}$, a resistor $R_{n1}$, a resistor $R_{n2}$ and a capacitor $C_{n1}$ between a pad 30 and a power line VSS. Similar structures are formed between the pad 30 and a power line VDD, an internal circuit 28 and the power line VDD, and the internal circuit 28 and the power line VSS. The secondary ESD protection circuit 26 is used to clamp voltages received by the internal circuit 28. The primary ESD protection circuit 24 is used to release most of the ESD stress. Therefore, a PMMOS $P_{ESD2}$ and an NMOS $N_{ESD2}$ in the secondary ESD protection circuit 26 are relatively small in comparison with a PMOS $P_{ESD1}$ and the NMOS $N_{ESD1}$ in the primary ESD protection circuit 24.

Figure 8:
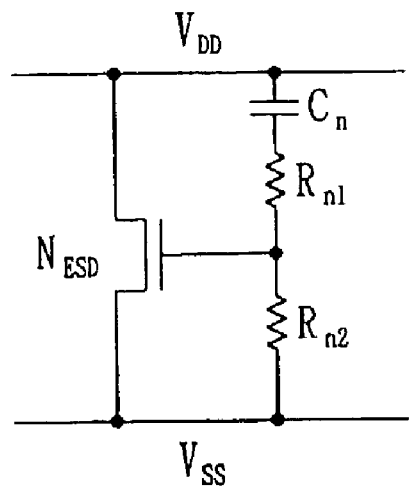
FIG. 8 is a power-rail ESD clamping circuit implented by an NMOS in accordance with the present invention.
Figure 9:
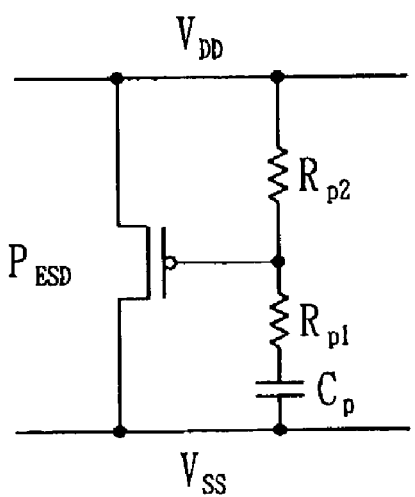
FIG. 9 is a power-line ESD clamping circuit implemented by a PMOS in accordance with the present invention.

The ESD protection circuit of the present invention is also suitable for application to ESD clamping circuits formed between power lines, as shown in FIGS. 8 and 9. An ESD clamping circuit between power lines implemented by an NMOS in accordance with the present invention is shown in FIG. 8. An ESD clamping circuit between power lines implemented by a PMOS in accordance with the present invention is shown in FIG. 9.

Voltages at gates in a conventional ESD protection circuit are difficult to maintain at an appropriate level. In comparison, the ESD protection circuit of the present invention formed by a short-circuited capacitor and a resistive voltage divider provides an appropriate voltage for NMOSs or PMOSs to release the optimum amount of ESD stress.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A two-stage electrostatic discharge (ESD) protection circuit, comprising:
   a primary ESD protection circuit comprising:
   a first primary discharging component, having a first control end; and
   a first primary ESD detection circuit, comprising:
   a first capacitor and a first resistor formed in series, and coupled between the first control end and a input/output pad of an IC; and
   a second resistor, coupled between the first control end and a first pad of the IC;
   a buffering resistor coupled between the input/output pad of the IC and an internal circuit of the IC; and
   a secondary ESD protection circuit comprising:
   a second primary discharging component, having a second control end; and a second ESD detection circuit, comprising:
   a second capacitor and a third resistor formed in series, and coupled between the second control end and the internal circuit of the IC; and
   a fourth resistor, coupled between the secoud control end and the first pad;
wherein the first and the second primary discharging components are closed during normal power operations, and triggered by the ESD detection circuit during an ESD event.

2. The ESD protection circuit in claim 1, wherein the primary ESD protection circuit further comprises:
   a third primary discharging component, having a third control end; and
   a third primary ESD detection circuit, comprising:
      a third capacitor and a fifty resistor formed in series, and coupled between the third control end and the input/output pad of the IC; and
      a second resistor, coupled between the third control end and a second pad of the IC; and
   the secondary ESD protection circuit further comprises:
      a fourth primary discharging component, having a fourth control end; and
      a fourth ESD detection circuit, comprising:
         a fourth capacitor and a sixth resistor formed in series, and coupled between the fourth control end and the internal circuit of the IC; and
         a seventh resistor, coupled between the fourth control end and the second pad of the IC;
   wherein the third and the fourth primary discharging components are closed during normal power operations, and triggered by the ESD detection circuit during the ESD event.

3. The ESD protection circuit in claim 2, wherein the first and the second primary discharging components are NMOS and the third and the fourth primary discharging components are PMOS.

* * * * *